(12) United States Patent
Lehr et al.

(10) Patent No.: US 6,387,792 B2
(45) Date of Patent: May 14, 2002

(54) METHOD OF FABRICATING A DIELECTRIC ANTIFUSE STRUCTURE

(75) Inventors: Matthias Lehr; Rene Tews, both of Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/888,021

(22) Filed: Jun. 22, 2001

(30) Foreign Application Priority Data

Jun. 22, 2000 (DE) .......................... 100 30 444

(51) Int. Cl.$^7$ ................................ H01L 29/00
(52) U.S. Cl. ...................... 438/600; 438/131
(58) Field of Search ............... 438/131, 467, 438/600

(56) References Cited

U.S. PATENT DOCUMENTS

| | | | |
|---|---|---|---|
| 5,602,053 A | | 2/1997 | Zheng et al. |
| 5,856,233 A | * | 1/1999 | Bryant et al. |
| 5,874,201 A | | 2/1999 | Licata et al. |
| 6,008,075 A | | 12/1999 | Lien et al. |
| 6,025,226 A | | 2/2000 | Gambino et al. |
| 6,124,194 A | | 9/2000 | Shao et al. |

FOREIGN PATENT DOCUMENTS

| | | |
|---|---|---|
| EP | 0975010 A1 | 1/2000 |
| EP | 1032039 A2 | 2/2000 |

* cited by examiner

Primary Examiner—Jey Tsai
(74) Attorney, Agent, or Firm—Laurence A. Greenberg; Werner H. Stemer; Ralph E. Locher

(57) ABSTRACT

A dielectric antifuse structure is fabricated in an integrated circuit. The antifuse structure is incorporated in a contact hole in an oxide layer and has a dielectric layer arranged between a first conductive layer and a second conductive layer.

16 Claims, 5 Drawing Sheets

METHOD OF FABRICATING A DIELECTRIC ANTIFUSE STRUCTURE

BACKGROUND OF THE INVENTION

Field of the Invention

The invention relates to a method for fabricating a dielectric antifuse structure.

Antifuse structures of this general type constitute connection elements which are used in integrated circuits in order, for example, to activate redundant memory cells in DRAMs. Furthermore, antifuse structures can be used in order to write identifiers to chips or in order to change functionalities of chips in a targeted manner. In particular, antifuse structures can be used as programmable connection elements in the field of FPGAs (field-programmable gate arrays).

A dielectric antifuse structure has a dielectric layer arranged between two conductive structures. As long as the dielectric layer is intact, no current flows via the antifuse structure. The dielectric layer can be destroyed by application of a predetermined voltage, with the result that a current can then flow via the antifuse structure.

Antifuse structures of this type can be incorporated in contact holes arranged in an oxide layer. A predetermined number of further contact holes are thereby additionally incorporated in the plane of the oxide layer. The further contact holes are used to fabricate contacts.

Such contacts, which are composed of tungsten or polysilicon, for example, then connect interconnects in interconnect planes and/or a silicon layer to integrated circuits, the interconnect planes and/or the silicon layer adjoining the underside and top side of the oxide layer.

In order to produce such structures, firstly contact holes are etched into the oxide layer at predetermined positions. For the case where the interconnects are composed of tungsten and the contacts arranged on their underside are composed of tungsten and/or polysilicon, the contacts composed of polysilicon are produced by filling the corresponding contact holes with polysilicon, while the contact holes for producing contacts made of tungsten initially remain empty. An organic antireflection layer is then applied to the oxide layer. Afterward, a photoresist layer is applied to the organic layer.

If only contacts and no antifuse structures are produced in the oxide layer, the contacts and the interconnects situated above them are fabricated in the following method steps:

Openings are produced in the resist layer in accordance with the geometries of the interconnects to be produced. Firstly, the organic antireflection layer is etched through these openings. During the etching process, part of the resist layer lying above it is also inevitably consumed as well. Trenches are then etched in the oxide layer through the openings thus produced. The trenches adjoin the contact holes at their top sides.

During the etching processes, in particular residues of the organic antireflection layer are also completely removed from the contact holes.

For the case where some of the contact holes are used for fabricating antifuse structures, a dielectric layer is deposited underneath the organic antireflection layer.

In contact holes for producing antifuse structures, a polysilicon layer, for example, is introduced as first conductive layer and the dielectric layer bears on its top side. The same applies to contact holes filled with polysilicon for fabricating contacts. By contrast, there is no dielectric layer in the contact holes for producing contacts made of tungsten.

During the subsequent etching of the organic antireflection layer and of the oxide layer, the openings in the resist layer are situated only above the contact holes for producing contacts, but not above the contact holes for producing antifuse structures.

After the etching of the organic antireflection layer, residues of this layer remain in the contact holes for fabricating contacts.

This is not critical for contact holes that are not filled with polysilicon, since there the residues of the antireflection layer bear on the bottom of the respective contact holes and at the same time protect the underlying layer, for example a silicon layer, with integrated circuits arranged therein.

Residues of the organic antireflection layer that are situated in contact holes are problematic, however. The residues bear on the dielectric layer, which in turn bears on the polysilicon.

In order to dissolve away the residues of the organic antireflection layer from the contact holes, the duration of the etching process would have to be lengthened for the purpose of removing the organic antireflection layer. The resist layer lying above it would thereby be consumed to an undesirably great extent, resulting in the widening of the trenches to be etched for the interconnects. As a result, the profiles of the interconnects would be widened and would no longer correspond to the required dimensions.

U.S. Pat. No. 5,602,053 describes a method of fabricating an antifuse structure. The antifuse structure is arranged between two conductive contacts. Each contact has a lateral barrier layer made of titanium nitride, titanium tungsten, or tantalum nitride. A layer made of aluminum, copper, tungsten, or silver is deposited within the barrier layer. A layer structure formed from four layers lying one above the other is applied as antifuse structure to the upper interface of such a contact. The first layer is composed of silicon nitride and bears on the interface of the contact. A layer made of amorphous silicon is applied to the silicon nitride layer, and a layer made of silicon nitride is in turn applied to the layer made of amorphous silicon. A further layer made of amorphous silicon is applied on the layer made of silicon nitride. Finally, the top side of the further layer made of amorphous silicon is adjoined by the second contact.

U.S. Pat. No. 5,874,201 relates to a method of fabricating a contact between two conductive structures of an integrated circuit. In a first method step, a contact hole is etched into an oxide layer, preferably an $SiO_2$ layer. An organic antireflection layer is applied to the $SiO_2$ layer. By exploiting the surface tension of the organic antireflection layer, the latter is applied to the $SiO_2$ layer in such a way that the contact hole remains free of the antireflection layer. In this case, the antireflection layer forms a rim around the upper edge of the contact hole, the top edge of the rim running with a curved profile in the region of the edge of the contact hole.

A resist layer is then applied to the organic antireflection layer. Through cutouts in the resist layer, the $SiO_2$ layer is once again etched in the region of the contact hole in order to produce defined, preferably asymmetrical, profiles of the contact hole, into which a conductive layer is then deposited for the purpose of forming the contact.

SUMMARY OF THE INVENTION

The object of the present invention is to provide a method of producing a dielectric antifuse structure which overcomes the above-noted deficiencies and disadvantages of the prior art devices and methods of this general kind, and which provides for antifuse structures that can be fabricated without adversely affecting the quality of other circuit structures.

With the above and other objects in view there is provided, in accordance with the invention, a method of fabricating dielectric antifuse structures, which comprises the following method steps:

provide an oxide layer having first contact holes for contacts and second contact holes for antifuse structures;

forming a dielectric layer on a surface of the oxide layer;

applying an organic antireflection layer to the dielectric layer;

applying a resist layer on the organic antireflection layer;

lithographically patterning the resist layer, wherein the second contact holes remain covered with the resist layer;

etching the organic antireflection layer through openings in the resist layer above the first contact holes and subsequently etching the oxide layer through openings in the organic antireflection layer for producing interconnect structures above the contacts;

etching residues of the antireflection layer in the first contact holes;

etching an uncovered part of the dielectric layer in the first contact holes;

removing the resist layer and underlying segments of the organic antireflection layer; and depositing a second conductive layer on the segments of the dielectric layer of the antifuse structures.

In other words, in order to fabricate a dielectric antifuse structure, a dielectric layer is applied in a first step to the surface of an oxide layer which has at least first contact holes for producing contacts and second contact holes for producing antifuse structures, the contact holes being at least partly filled with a first conductive layer.

An organic antireflection layer is then applied to the dielectric layer.

A resist layer is then applied to the organic antireflection layer. In a further method step, the resist layer is patterned by means of a lithography process, the second contact holes remaining covered with the resist layer.

Afterward, the organic antireflection layer is etched through openings in the resist layer above the first contact holes, and the oxide layer is subsequently etched through openings in the organic antireflection layer for the purpose of producing interconnect structures above the contacts.

This is followed by etching of residues of the antireflection layer in the first contact holes.

This is followed by etching of the uncovered part of the dielectric layer in the first contact holes.

Finally, the resist layer and the underlying segments of the organic antireflection layer are removed and a second conductive layer is deposited on the layer segments of the dielectric layer segments of the antifuse structures.

Consequently, the basic concept of the invention is that, in order to produce trenches in the oxide layer in order to fabricate interconnects adjoining the top sides of contacts, the organic antireflection layer is etched in such a way that the required profiles of the trenches for the interconnect are obtained during the subsequent etching of the oxide layer. In this case, it is deliberately accepted that residues of the organic antireflection layer will still be situated in particular in contact holes for producing contacts from a first conductive layer, preferably made of polysilicon, which is deposited into these contact holes and on which the dielectric layer bears.

The residues of the organic antireflection layer which bear on the dielectric layer in these contact holes are then removed in a second etching process following the etching of the trenches in the oxide layer.

For this purpose, an etching process with high selectivity with respect to the oxide layer is preferably chosen. During this etching process, the trench profiles in the oxide layer are not adversely affected, rather only the residues of the organic antireflection layer in the contact holes for fabricating the contacts are removed.

The uncovered dielectric layer is then removed, whereupon the resist layer, in particular above the contact holes for producing the antifuse structures, is removed.

This is followed by the deposition of the second conductive structure in the contact holes for fabricating the antifuse structure and also the deposition of the conductive layers for fabricating the interconnects.

In this way, it is possible to fabricate the antifuse structures with high process reliability, without adversely affecting the quality of the surrounding circuit structures, in particular the interconnects and the underlying contacts.

In an advantageous embodiment of the invention, the antifuse structure is formed by a polysilicon layer deposited in a contact hole. Its top side is adjoined by the dielectric layer, which is preferably formed by an $Si_3N_4$ layer. This dielectric layer additionally extends on the side walls of the contact hole, as far as the upper edge thereof. An adhesion layer, which is preferably formed by a titanium layer, is applied to the dielectric layer.

A tungsten layer, as second conductive layer of the antifuse structure, adjoins the top side of the adhesion layer and fills the contact hole up to the upper edge.

Preferably, the interconnects of the interconnects running above the contacts are likewise composed of tungsten, so that the production of the second conductive layers of the antifuse structures of the contacts and also of the interconnects can be performed in one process step.

Other features which are considered as characteristic for the invention are set forth in the appended claims.

Although the invention is illustrated and described herein as embodied in a method for fabricating a dielectric antifuse structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
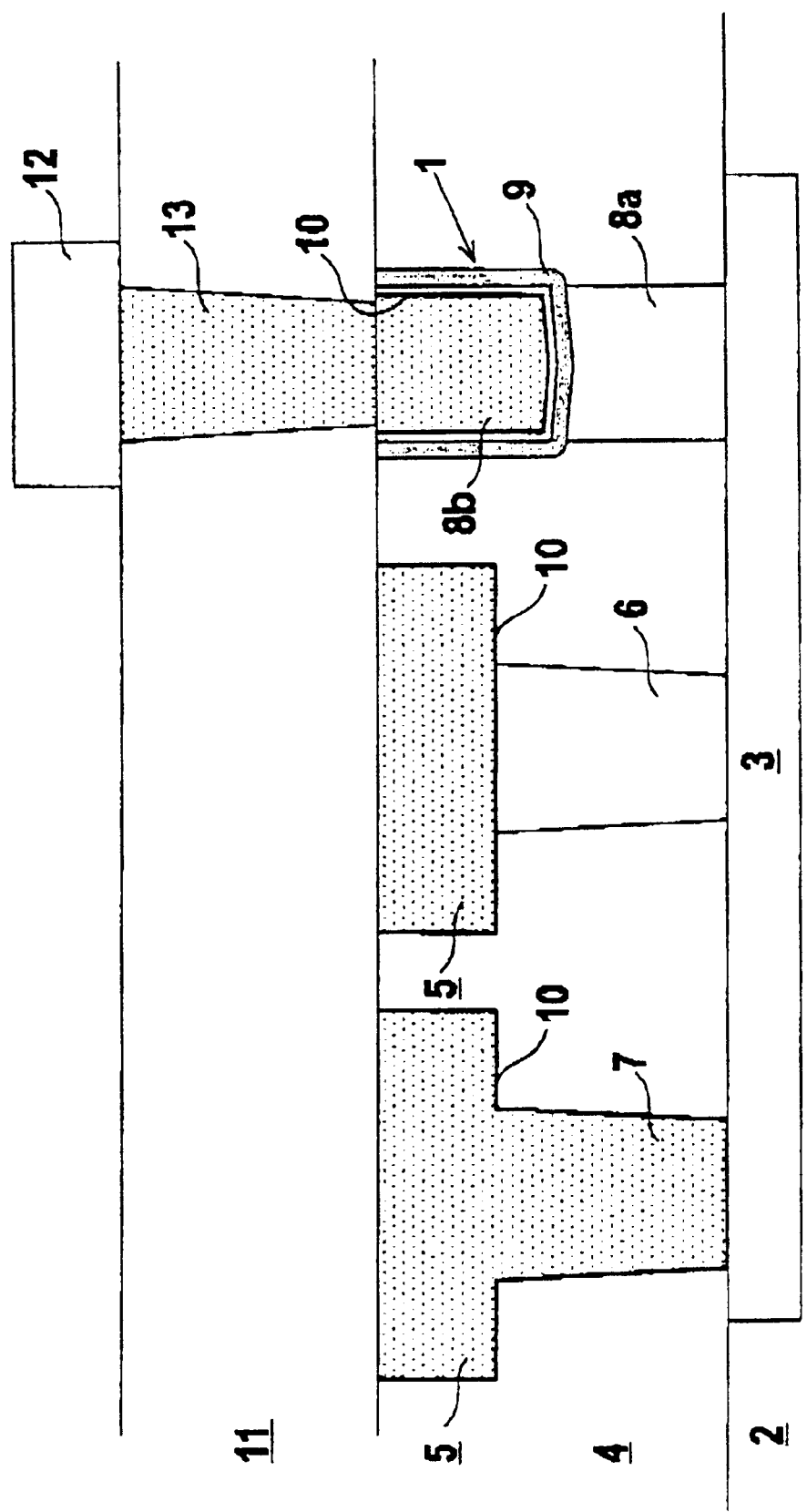
FIG. 1 is a diagrammatic illustration of a detail of an integrated circuit with an antifuse structure according to the invention.

Referring now to the figures of the drawing in detail and first, particularly, to FIG. 1 thereof, there is seen a diagrammatic detail from an integrated circuit with an exemplary embodiment of the antifuse structure 1 according to the invention.

The structure illustrated in FIG. 1 has a silicon layer 2. Integrated circuits are incorporated in an active region 3 of the silicon layer 2. A first oxide layer 4 lies above the silicon layer 2. The first oxide layer 4, for example, is an SiO$_2$ layer. A first interconnect plane runs above this oxide layer 4. Contacts 6, 7 running in the oxide layer 4 are provided for connecting interconnects 5 in the interconnect plane to the active region 3 of the silicon layer 2. In addition, an antifuse structure 1 according to the invention runs in the oxide layer 4.

The interconnects 5 in the first interconnect plane are composed of tungsten. On the one hand, contacts 6 composed of polysilicon lead from the interconnects 5 to the silicon layer 2. In addition, contacts 7 composed of tungsten lead from the interconnects 5 to the silicon layer 2.

The antifuse structure 1 has a first conductive layer 8a composed of polysilicon. The underside of the layer 8a adjoins the active region 3 of the silicon layer 2. A second conductive layer 8b composed of tungsten is provided above the first conductive layer 8a. The second conductive layer 8b runs essentially in the first interconnect plane.

The two conductive layers 8a, 8b of the antifuse structure 1 are insulated from one another by a dielectric layer 9. In this case, the dielectric layer 9 bounds the underside and also the side areas of the second conductive layer 8b. In the present exemplary embodiment, the dielectric layer 9 is composed of Si$_3$N$_4$.

An adhesion layer 10, which is preferably formed by a thin titanium layer, lies between the tungsten layer and the dielectric layer 9 made of Si$_3$N$_4$.

This adhesion layer 10 additionally lies on the side edges and undersides of the interconnects 5 composed of tungsten and also on the side edges and the underside of the contact 7 composed of tungsten.

In the case of the antifuse structure 1, no current flows via the conductive layers 8a, 8b as long as the dielectric layer 9 is intact. The dielectric layer 9 can be destroyed by application of a predetermined voltage to the antifuse structure 1, so that a current can then flow via the antifuse structure 1.

These antifuse structures 1 can be used for example for activating redundant memory cells in DRAMs. In addition, the antifuse structures 1 can be used for writing identifiers to chips or for changing functionalities of chips.

Situated above the first interconnect plane is a second oxide layer 11, the top side of which is adjoined by a second interconnect plane. An interconnect 12 which runs in the second interconnect plane and is composed of aluminum is illustrated in FIG. 1. The interconnect 12 is connected to the second conductive layer 8b of the antifuse structure 1 via a contact 13 running in the second oxide layer 11. Like the second conductive layer 8b, the contact 13 is composed of tungsten.

Referring now to FIGS. 2–5, there is illustrated a sequence with the essential method steps for fabricating the antifuse structure 1 according to the invention.

Figure 2:
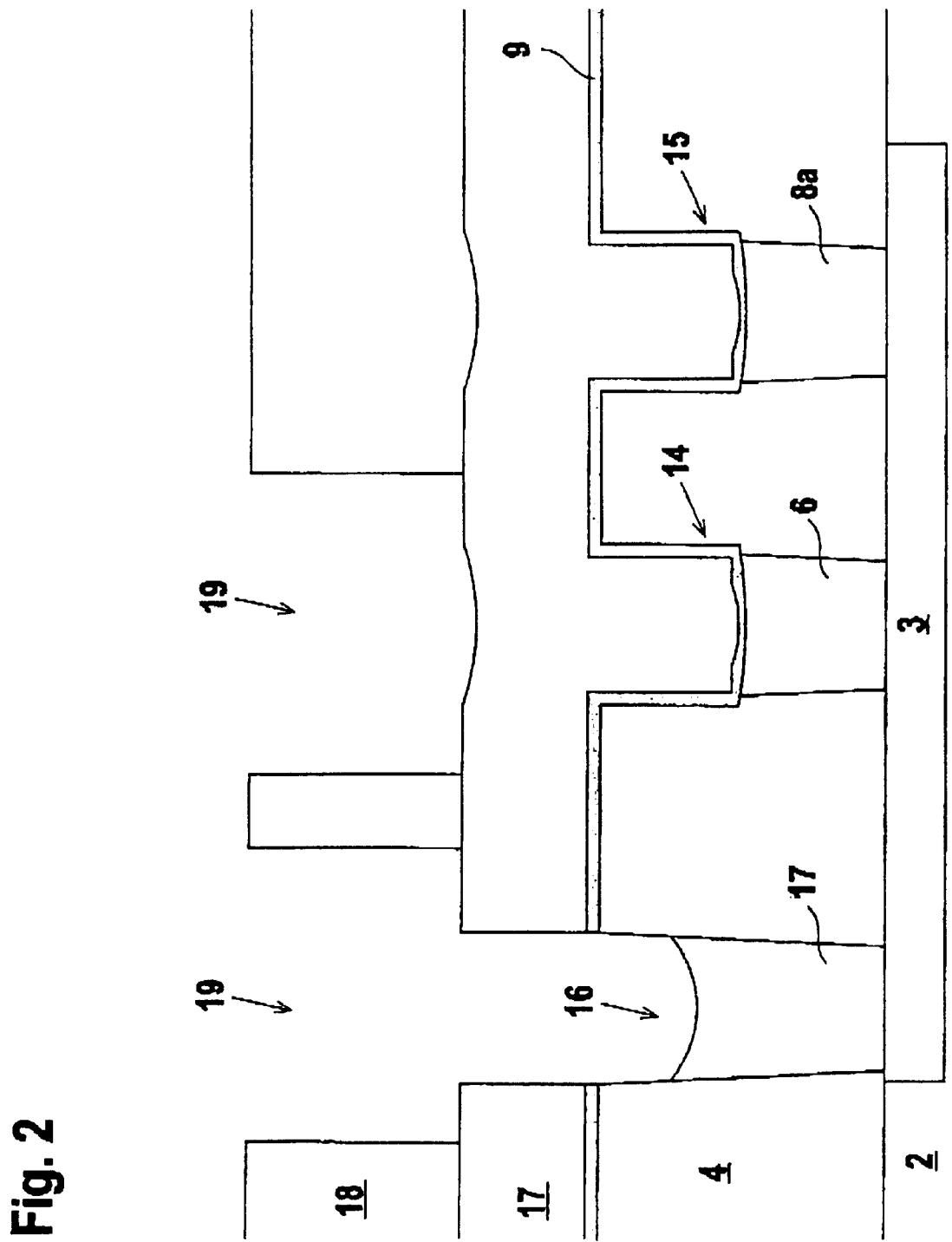
FIGS. 2–5 are diagrammatic illustrations of various method steps for fabricating the structure according to FIG. 1.

FIG. 2 illustrates first, second and third contact holes 14, 15, 16 which are etched into the first oxide layer 4 and serve for fabricating the contacts 6, 7 and the antifuse structure 1. The contact holes 14, 15, 16 penetrate through the oxide layer 4 completely in each case, so that they emerge in each case on the top side of the active region 3 of the silicon layer 2.

A polysilicon layer is deposited in each case into the first and second contact holes 14, 15. The polysilicon layers in the first contact holes 14 form the contacts 6 which are composed of polysilicon and lead to the first interconnect plane.

The polysilicon layers in the second contact holes 15 form the first conductive layers 8a of the antifuse structures 1.

The third contact holes 16, which contain no polysilicon, serve for fabricating the contacts 7 composed of tungsten.

The dielectric layer 9 for forming the antifuse structures 1 is applied to the oxide layer 4 and also the polysilicon layers in the first and second contact holes 14, 15. By contrast, the dielectric layer 9 is removed in the regions of the third contact holes 16.

An organic antireflection layer 17 is applied to the dielectric layer 9. In particular, the first and second contact holes 14, 15 are filled with the antireflection layer 17. Parts of the antireflection layer 17 are also situated in the third contact holes 16.

A resist layer 18 is applied to the organic antireflection layer 17. FIG. 2 shows the resist layer 18 patterned in the course of a lithography process. The resist layer 18 has openings 19 above the second and third contact holes 15, 16. These openings 19 serve for fabricating the interconnects 5 running above the first and third contact holes 14, 16 in the first interconnect plane.

By contrast, no openings 19 in the resist layer 18 are provided above the second contact holes 15 which serve for fabricating the antifuse structures 1.

Figure 3:
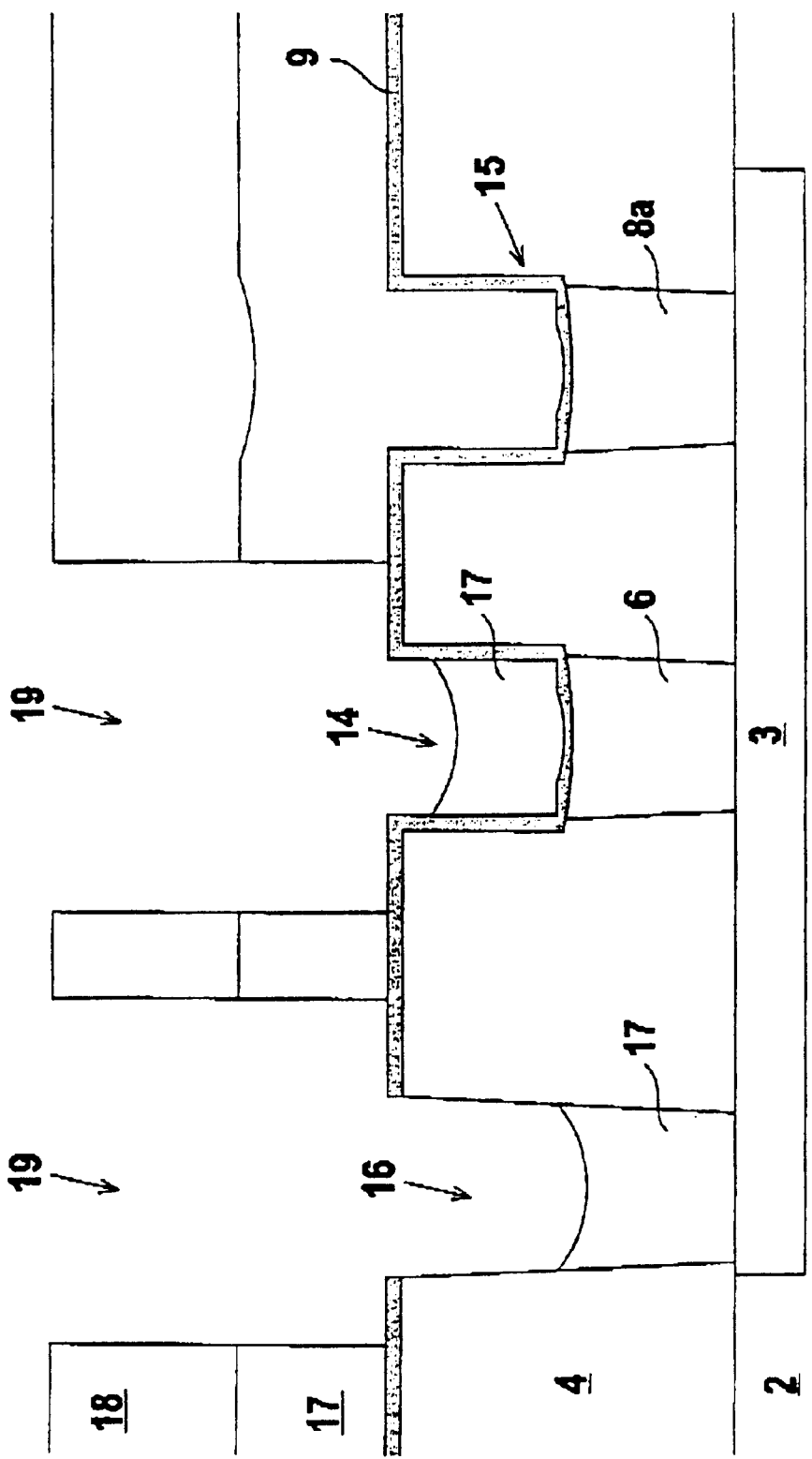

The organic antireflection layer 17 is etched through the openings 19 in the resist layer 18. The result of this etching a is illustrated in FIG. 3. Strongly anisotropic etching chemistry is preferably used to carry out this etching process.

The organic antireflection layer 17 is etched through the openings 19 in the resist layer 18 as far as the dielectric layer 9 lying on the top side of the oxide layer 4. In this case, the etching chemistry and the etching time of the etching process are chosen such that the profiles of the openings 19 in the resist layer 18 are preserved and are not widened. By the same token it is accepted that residues of the organic antireflection layer 17 will still remain in the first and third contact holes 14, 16.

The residues of the organic antireflection layer 17 in the third contact holes 16 lie on the top side of the active region 3 of the silicon layer 2 and protect the latter against damage.

By contrast, the residues of the organic antireflection layer 17 in the first contact holes 14 bear on the dielectric layer 9 and thus prevent removal of the dielectric layer 9 in these regions.

Figure 4:
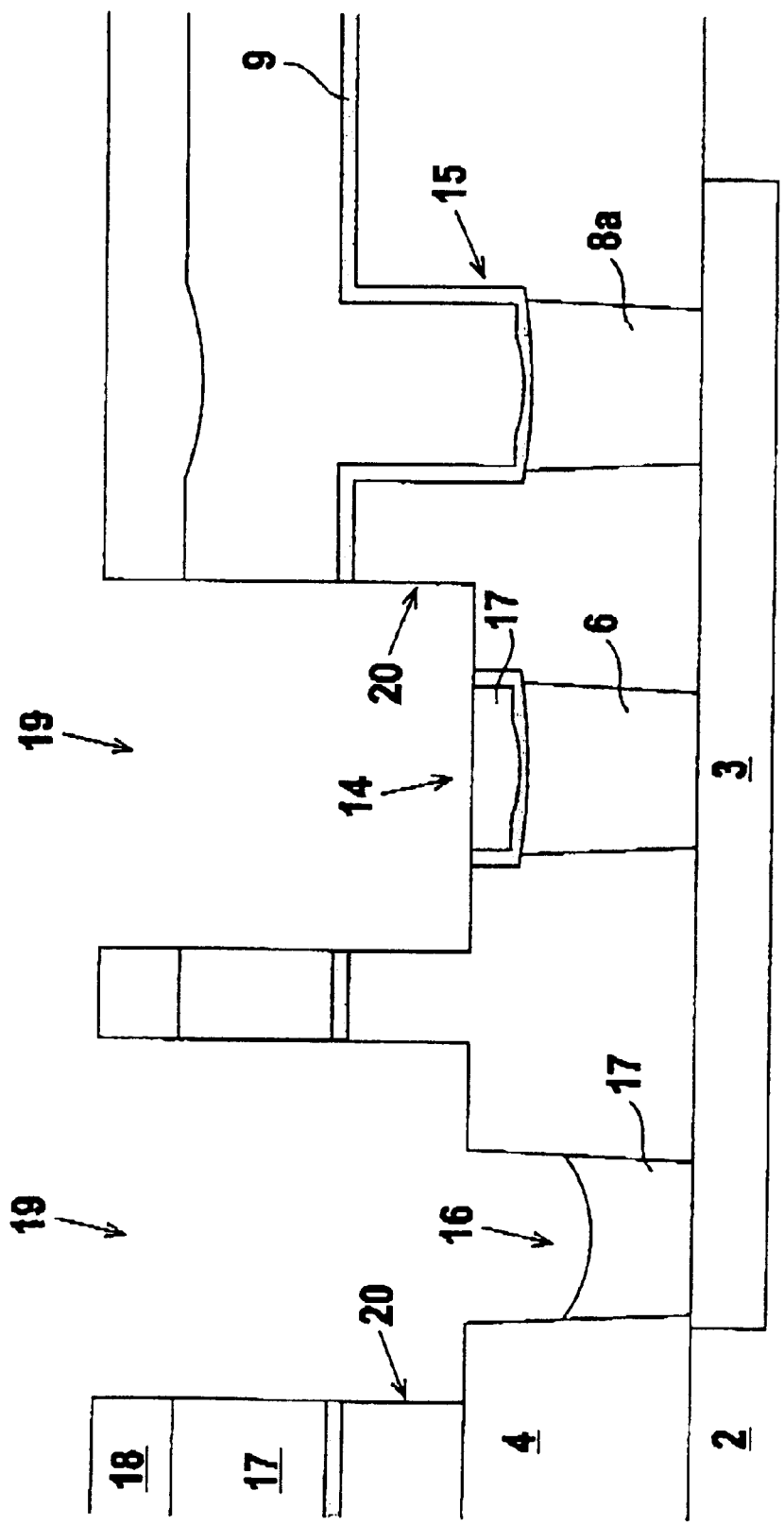

This first etching process is followed by the etching for producing the trenches 20 in the oxide layer 4, the interconnects 5 of the first interconnect plane running in the trenches. The result of this trench etching is illustrated in FIG. 4.

During this trench etching, trenches 20 are produced in the oxide layer 4 in accordance with the geometries of the openings 19 in the resist layer 18, the undersides of which trenches are adjoined by the upper edges of the first and third contact holes 14, 16. A fluorine-containing etching chemistry is preferably used for this etching process. During this etching process, the uncovered parts of the dielectric layer 9 in the region of the trenches 20 are also removed. Parts of the residues of the organic antireflection layer 17 which lie in the first and third contact holes 14, 16 are also removed during this etching process. However, a small residue of the antireflection layer 17 with the underlying dielectric layer 9 still remains in particular in the first contact holes 14.

In order to remove these residues of the dielectric layer 9, a further etching process is carried out according to the invention.

Figure 5:
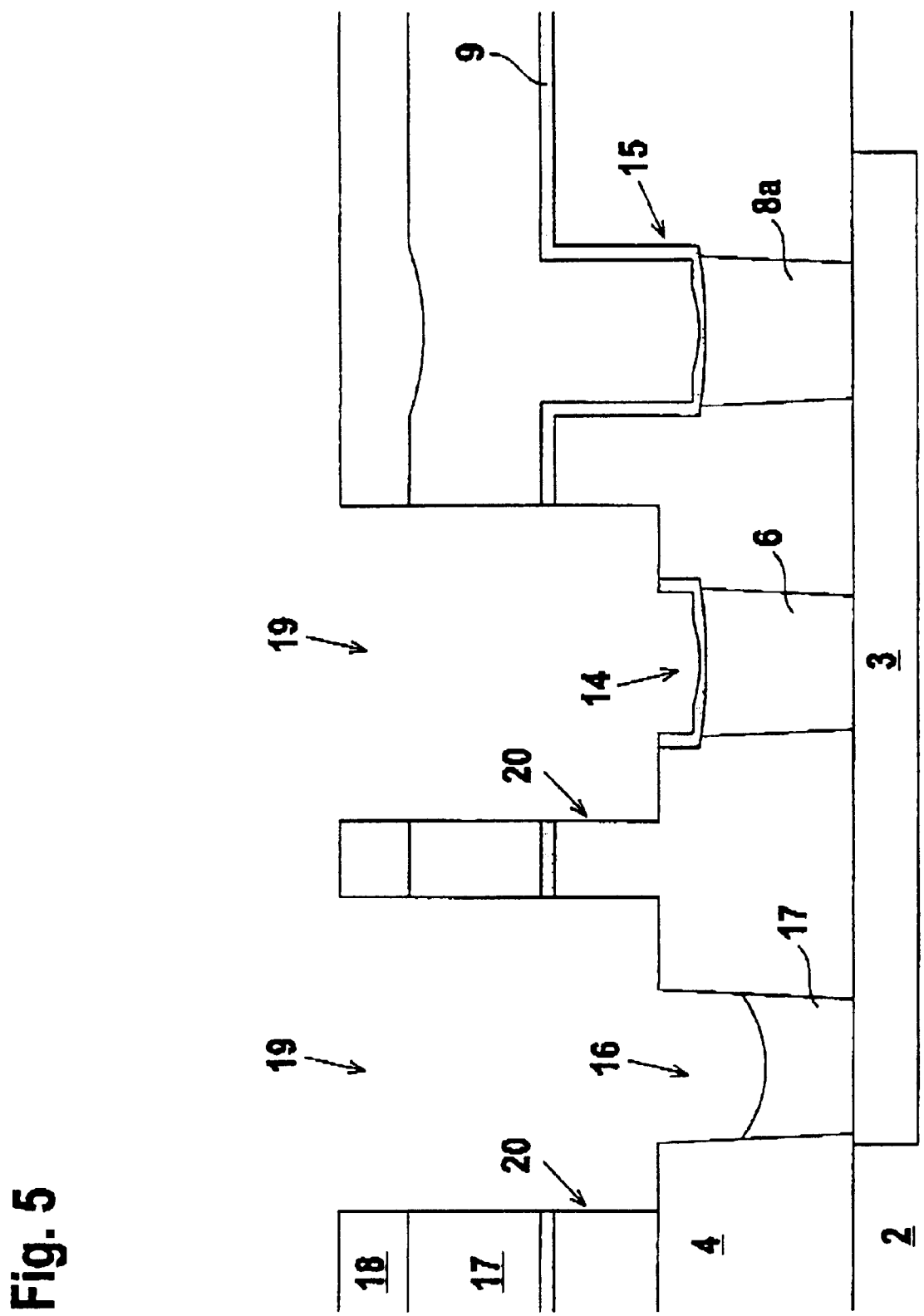

For this purpose, an etching chemistry which has high etching selectivity with respect to the oxide layer 4 is advantageously used. Such an etching chemistry preferably comprises $N_2/O_2$. As a result, during this etching process, the profiles for producing the interconnects are not adversely affected, but the residues of the organic antireflection layer 17 are completely eliminated from the first contact holes 14 (FIG. 5).

Afterward, the dielectric layer 9 in the first contact holes 14 is removed by means of a second etching process. The fluorine-containing etching chemistry already used during the trench etching is preferably used for this purpose.

The resist layer 18 with the underlying antireflection layer 17 is subsequently removed.

In a further method step, the adhesion layer 10 is applied, which bounds the interconnects 5, the contacts 7 and also the second conductive layer 8b on the lateral and lower edges thereof.

Afterward, tungsten is deposited in order to produce the contacts 6, 7 composed of tungsten and also the second conductive layer 8b of the antifuse structures 1. The interconnects 5 of the first interconnect plane are also produced in the same deposition process.

Afterward, the second oxide layer 11 is applied, into which the contacts 13 made of tungsten which are led to the antifuse structures 1 are incorporated.

Finally, the interconnects 12 made of aluminum which run above the second oxide layer 11 are fabricated in a known manner.

We claim:

1. A method of fabricating dielectric antifuse structures, which comprises the following method steps:
   providing an oxide layer having first contact holes for contacts and second contact holes for antifuse structures;
   forming a dielectric layer on a surface of the oxide layer;
   applying an organic antireflection layer to the dielectric layer;
   applying a resist layer on the organic antireflection layer;
   lithographically patterning the resist layer, wherein the second contact holes remain covered with the resist layer;
   etching the organic antireflection layer through openings in the resist layer above the first contact holes and
   subsequently etching the oxide layer through openings in the organic antireflection layer for producing interconnect structures above the contacts;
   etching residues of the antireflection layer in the first contact holes;
   etching an uncovered part of the dielectric layer in the first contact holes;
   removing the resist layer and underlying segments of the organic antireflection layer; and
   depositing a second conductive layer on the segments of the dielectric layer of the antifuse structures.

2. The method according to claim 1, wherein the step of depositing the second conductive layer above the contacts forms interconnects.

3. The method according to claim 1, which comprises providing the oxide layer with third contact holes for producing contacts, which are not filled with the first conductive layer.

4. The method according to claim 3, which comprises, during the step of patterning the resist layer, producing openings situated in the resist layer above the third contact holes for producing interconnects.

5. The method according to claim 3, which comprises partly filling the third contact holes with the organic antireflection layer.

6. The method according to claim 3, which comprises producing contacts, and then interconnects, by depositing the second conductive layer into the third contact holes and the trenches adjoining the top sides thereof.

7. The method according to claim 1, wherein the step of etching the residues of the antireflection layer in the first contact holes comprises setting a high etching selectivity with respect to the oxide layer.

8. The method according to claim 1, wherein the dielectric layer is composed of $Si_3N_4$.

9. The method according to claim 1, wherein the first conductive layer is composed of polysilicon.

10. The method according to claim 1, wherein the second conductive layer is composed of tungsten.

11. The method according to claim 10, which comprises forming an adhesion layer in the second contact holes between the dielectric layer and the second conductive layer.

12. The method according to claim 11, which comprises forming the adhesion layer as a Ti layer.

13. The method according to claim 1, wherein the providing step comprises forming contact holes with undersides adjoining a silicon layer having integrated circuits incorporated therein.

14. The method according to claim 1, which comprises forming an interconnect and connecting a top side of an antifuse structure to the interconnect with a contact.

15. The method according to claim 14, which comprises forming the contact of tungsten and the interconnect of aluminum.

16. The method according to claim 1, wherein the providing step comprises at least partly filling the second contact holes with a first conductive layer.

* * * * *